(12) United States Patent
Ookuma et al.

(10) Patent No.: US 11,177,277 B2
(45) Date of Patent: Nov. 16, 2021

(54) WORD LINE ARCHITECTURE FOR THREE DIMENSIONAL NAND FLASH MEMORY

(71) Applicant: SanDisk Technologies LLC, Addison, TX (US)

(72) Inventors: Naoki Ookuma, Kanagawa (JP); Hiroki Yabe, Kanagawa (JP); Koichiro Hayashi, Kanagawa (JP); Takuya Ariki, Kanagawa (JP); Toru Miwa, Kanagawa (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/675,800

(22) Filed: Nov. 6, 2019

(65) Prior Publication Data

US 2021/0134828 A1    May 6, 2021

(51) Int. Cl.
*H01L 27/11582* (2017.01)
*H01L 23/528* (2006.01)
*H01L 27/11526* (2017.01)
*H01L 27/11556* (2017.01)
*H01L 21/02* (2006.01)
*H01L 21/28* (2006.01)
(Continued)

(52) U.S. Cl.
CPC .. *H01L 27/11582* (2013.01); *H01L 21/02636* (2013.01); *H01L 23/5283* (2013.01); *H01L 27/11526* (2013.01); *H01L 27/11556* (2013.01); *H01L 27/11573* (2013.01); *H01L 29/40114* (2019.08); *H01L 29/40117* (2019.08); *H01L 21/0217* (2013.01); *H01L 21/0274* (2013.01); *H01L 21/02164* (2013.01); *H01L 21/02208* (2013.01); *H01L 21/02271* (2013.01); *H01L 21/31116* (2013.01)

(58) Field of Classification Search
CPC ......... H01L 27/11521; H01L 27/11526; H01L 27/11548; H01L 27/11551; H01L 27/11556; H01L 27/11568; H01L 27/11573; H01L 27/11575; H01L 27/11582
See application file for complete search history.

(56) References Cited

U.S. PATENT DOCUMENTS 8,865,535 B2    10/2014  Rabkin et al.
9,123,749 B2 *  9/2015   Kawai ............... H01L 29/66833
(Continued)

*Primary Examiner* — Allison Bernstein
(74) *Attorney, Agent, or Firm* — Dickinson Wright PLLC; Steven Hurles

(57) ABSTRACT

A non-volatile memory apparatus is provided and includes a substrate having a major surface extending longitudinally. A stack of first and second sets of word lines and insulating layers extends along and over the major surface longitudinally and alternating with and overlying one another vertically to define a device region. The first and second sets of word lines each respectively extends longitudinally beyond a first and second side of the device region a decreasing longitudinal distance from the device region as a vertical distance from the major surface increases to define first and second stepped contact regions. Word line contacts extend vertically in the first and second stepped contact regions. The second set of word lines in the first stepped contact region do not contact the word line contacts and the first set of word lines in the second stepped contact region do not contact the word line contacts.

19 Claims, 11 Drawing Sheets

(51) Int. Cl.
*H01L 27/11573* (2017.01)
*H01L 21/311* (2006.01)
*H01L 21/027* (2006.01)

(56) References Cited

U.S. PATENT DOCUMENTS

| | | | |
|---|---|---|---|
| 9,142,455 B2 * | 9/2015 | Kim | H01L 21/76807 |
| 9,356,034 B1 | 5/2016 | Yada et al. | |
| 9,524,901 B2 | 12/2016 | Izumi et al. | |
| 9,679,946 B2 | 6/2017 | Shepard | |
| 2016/0071876 A1 | 3/2016 | Mizuno et al. | |
| 2018/0293029 A1 | 10/2018 | Achtenberg et al. | |

* cited by examiner

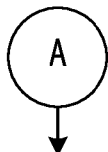

FORMING A SECOND PLURALITY OF WORD LINE CONTACTS EACH EXTENDING ALONG THE VERTICAL AXIS AND ARRANGED NEXT TO ONE ANOTHER RECTILINEARLY ALONG THE LONGITUDINAL AXIS IN THE SECOND STEPPED CONTACT REGION, WHEREIN EACH OF THE SECOND PLURALITY OF WORD LINE CONTACTS IS IN CONTACT WITH A RESPECTIVE SECOND CONTACT PORTION OF ONE OF THE SECOND SET OF WORD LINES AND AT LEAST A PORTION OF THE FIRST SET OF WORD LINES IN THE SECOND STEPPED CONTACT REGION DO NOT CONTACT THE SECOND PLURALITY OF WORD LINE CONTACTS ~114

*FIG. 6B*

WORD LINE ARCHITECTURE FOR THREE DIMENSIONAL NAND FLASH MEMORY

FIELD

This application relates to the structure of re-programmable non-volatile memory apparatuses such as semiconductor flash memory, and, more specifically, to a word line architecture of a three dimensional non-volatile memory apparatus.

BACKGROUND

This section provides background information related to the technology associated with the present disclosure and, as such, is not necessarily prior art.

Multilevel metal interconnect structures are routinely employed to provide electrical wiring for a high density circuitry, such as semiconductor devices on a substrate. Continuous scaling of semiconductor devices leads to a higher wiring density as well as an increase in the number of wiring levels. Recently, ultra high density storage devices have been proposed using a three-dimensional (3D) stacked memory structure sometimes referred to as a Bit Cost Scalable (BiCS) architecture. Such ultra high density storage devices include a large number of interconnect wiring levels. For example, a 3D NAND stacked memory device may include at least as many number of wiring levels as the total number of control gate electrodes employed for the 3D NAND stacked memory device. The wiring levels are typically connected to a metal layer above the wiring layers using a stepped or terraced region. Nevertheless, the arrangements of contacts in the stepped or terraced region becomes progressively difficult as the number of wiring layers increases. Accordingly, there is still a need for more improved non-volatile memory apparatuses while providing adequate performance.

SUMMARY

This section provides a general summary of the present disclosure and is not a comprehensive disclosure of its full scope or all of its features and advantages.

An object of the present disclosure is to provide a memory apparatus and a method of forming the memory apparatus that address and overcome the above-noted shortcomings.

Accordingly, it is an aspect of the present disclosure to provide a memory apparatus including at least one stack of a plurality of word lines. The plurality of word lines comprise a first set of word lines and a second set of word lines. The first set of word lines define a first stepped contact region having a plurality of first steps. Similarly, the second set of word lines define a second stepped contact region having a plurality of second steps. The first stepped contact region and the second stepped contact region are on opposite sides of a device region. The first set of word lines terminate at and do not extend into the second stepped contact region.

According to another aspect of the disclosure, a method of forming a memory apparatus is also provided. The method includes the step of forming at least one stack of a plurality of word lines, wherein the plurality of word lines comprise a first set of word lines and a second set of word lines. The method continues with the step of extending the first set of word lines to define a first stepped contact region having a plurality of first steps on one side of a device region. The next step of the method is extending the second set of word lines to define a second stepped contact region having a plurality of second steps on an opposite side of the device region as the first stepped contact region. The method also includes the step of terminating the first set of word lines at the second stepped contact region.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1 illustrates a vertical cross-sectional view of a first embodiment of a non-volatile memory apparatus containing vertical NAND memory devices or cells according to aspects of the disclosure;

FIG. 2A illustrates another vertical cross-sectional view of the first embodiment of the non-volatile memory apparatus showing a first plurality of word line contacts connected to a plurality of upper word lines in a first stepped contact region and a second plurality of word line contacts connected to a plurality of lower word lines in a second stepped contact region according to aspects of the disclosure;

Figure 4:
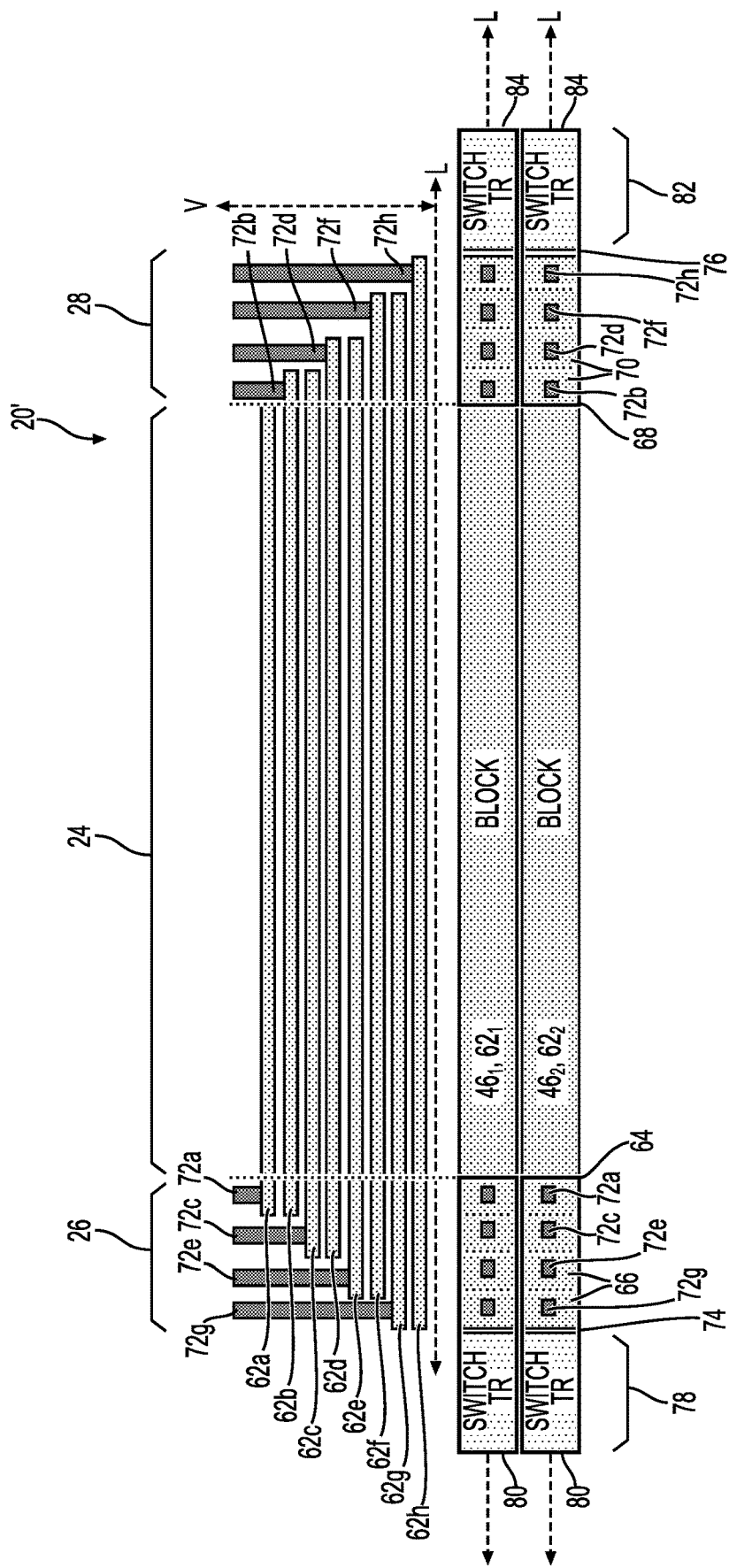
Figure 5:
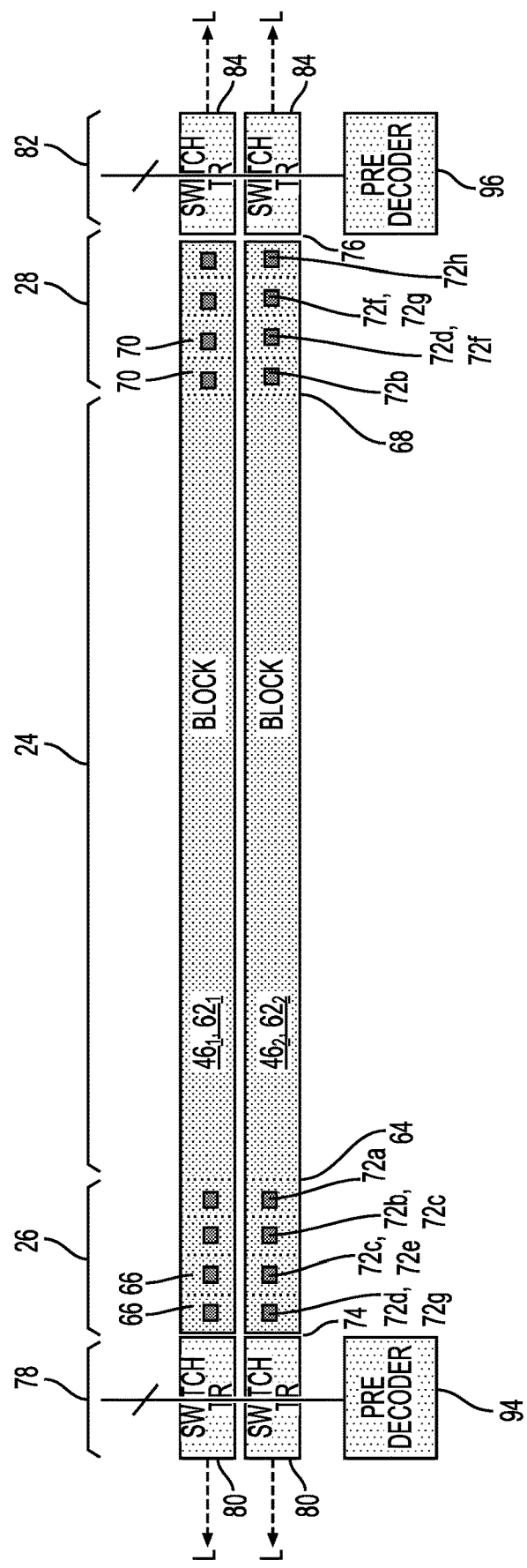
Figure 6A:
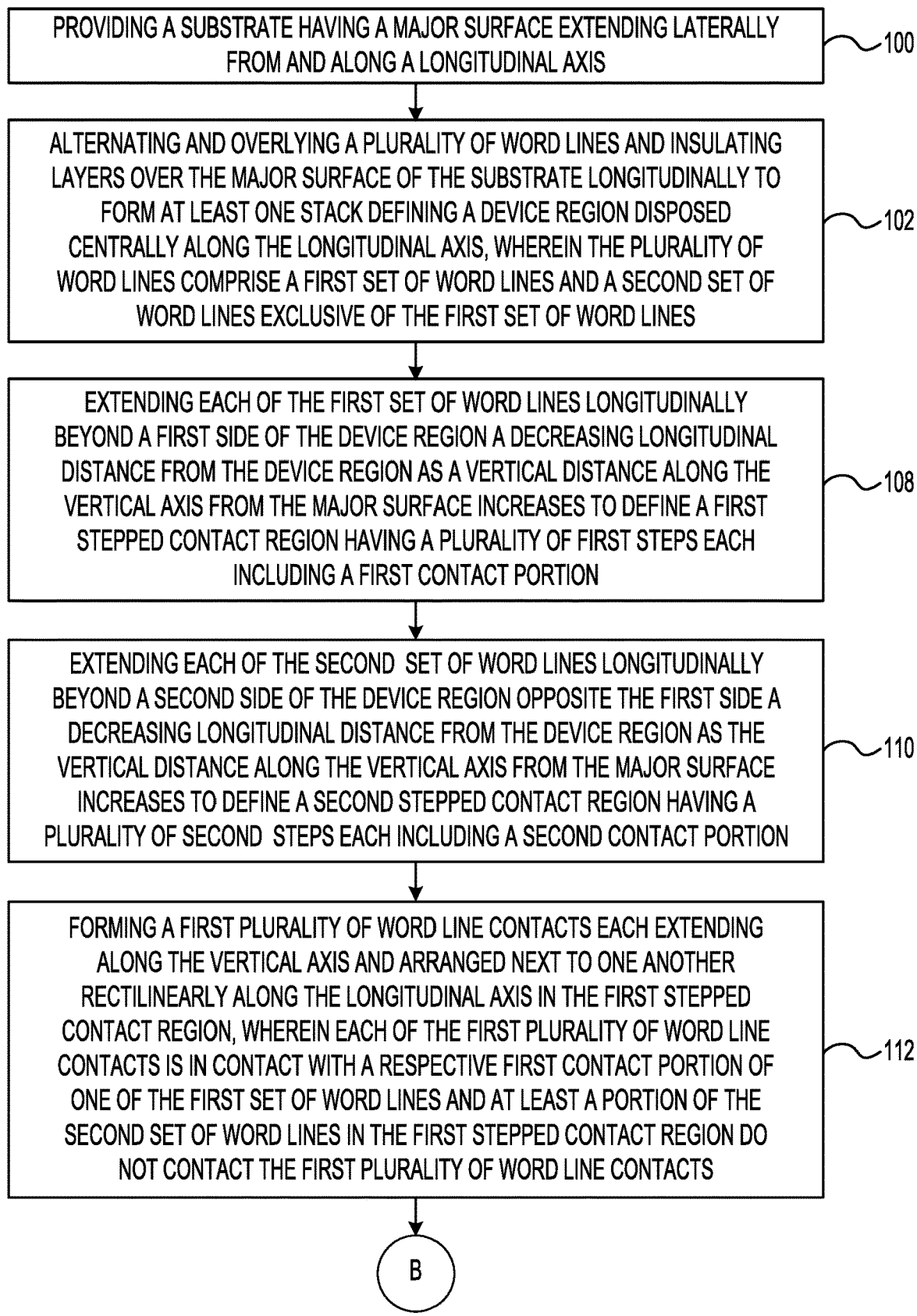
Figure 7A:
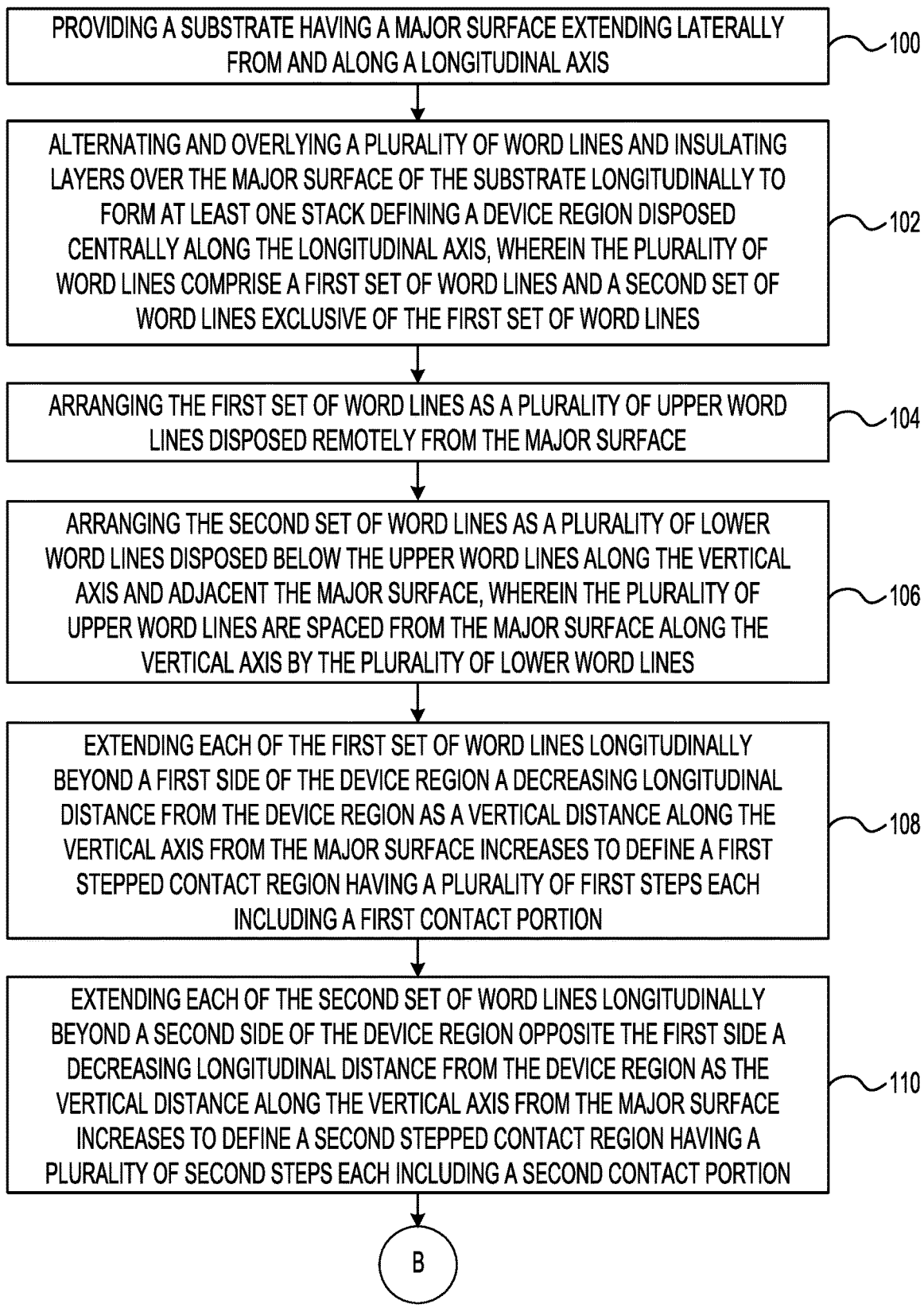
Figure 7B:
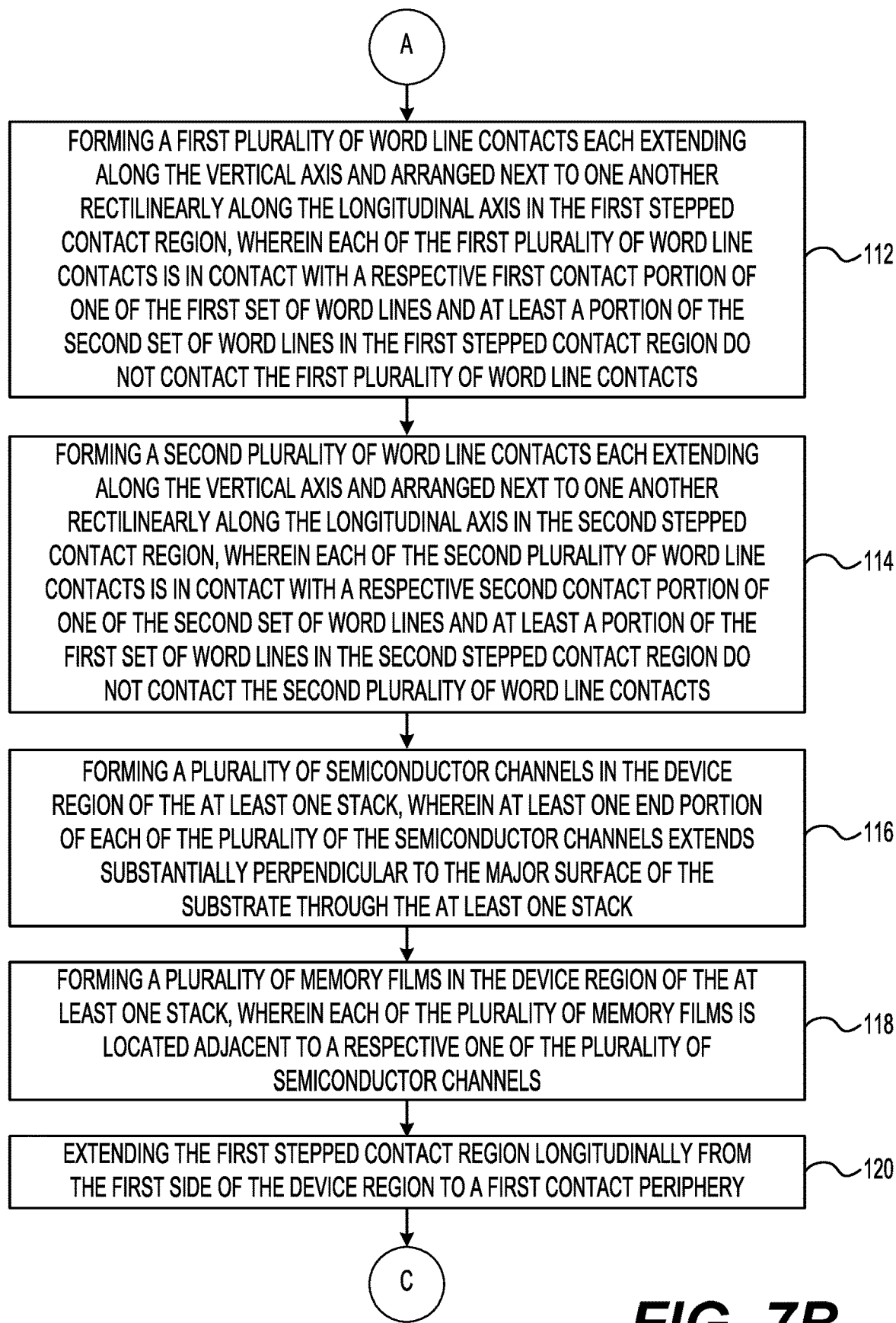
Figure 7C:
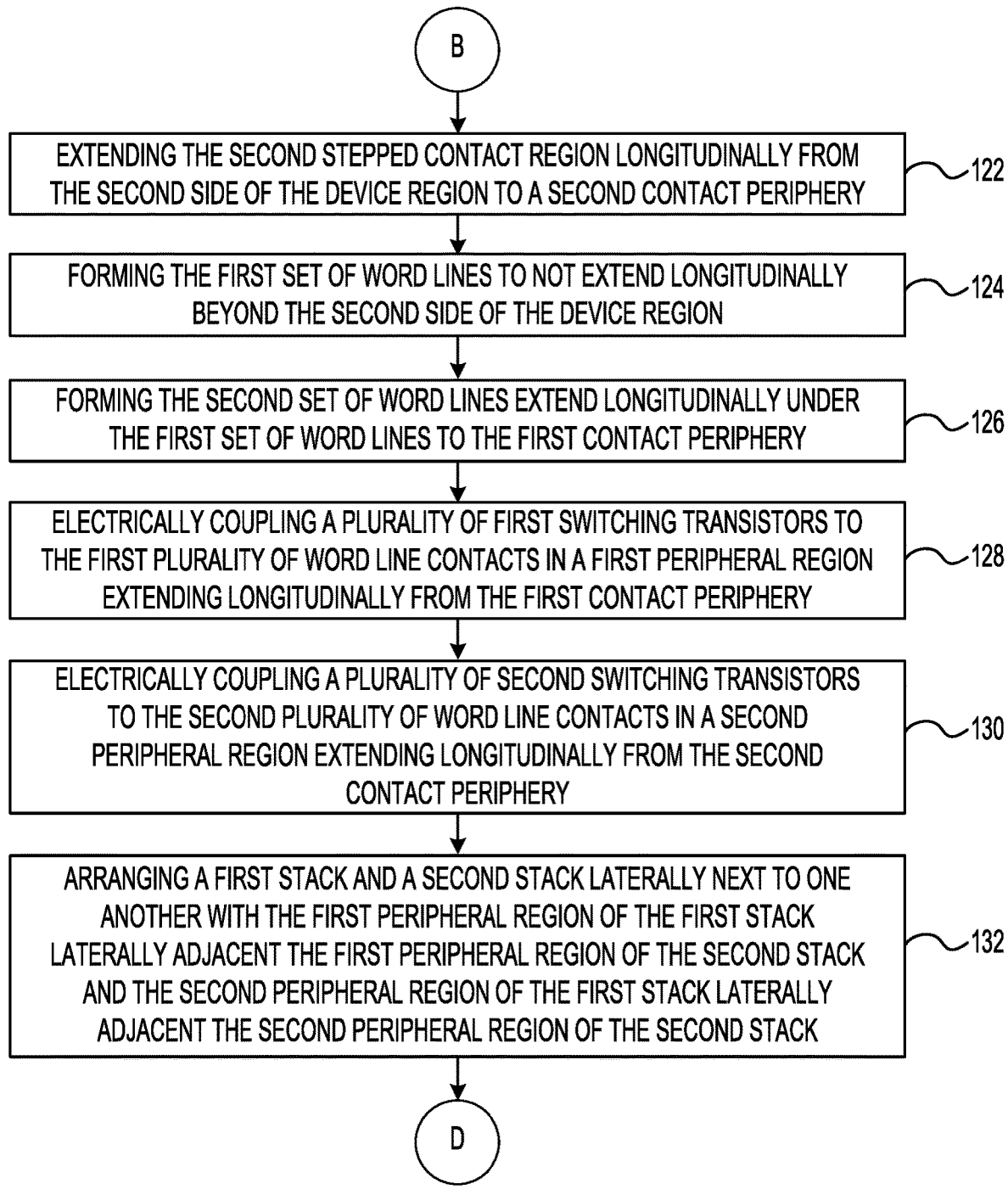
Figure 7D:
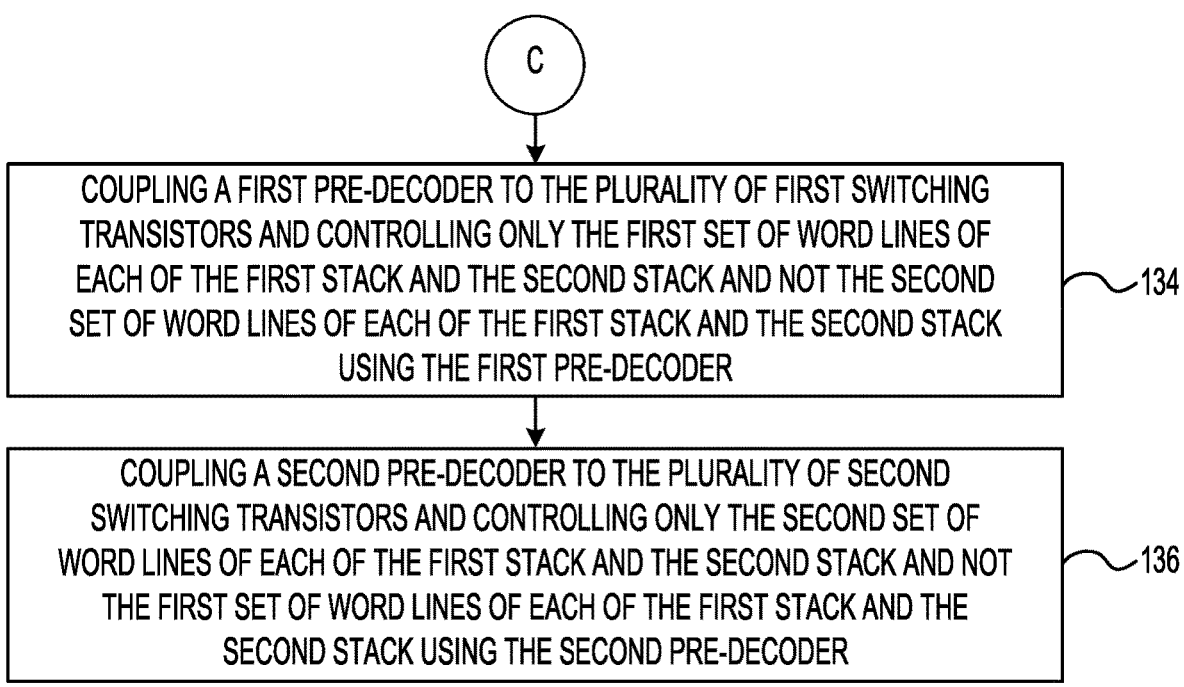

FIG. 4 illustrates vertical cross-sectional and plan views of a second embodiment of a non-volatile memory apparatus showing a first plurality of word line contacts connected to a plurality of odd numbered word lines in a first stepped contact region and a second plurality of word line contacts connected to a plurality of even numbered word lines in a second stepped contact region of a first and second stack according to aspects of the disclosure;

FIG. 5 illustrates a plan view of the both the first and second embodiments of the non-volatile memory apparatus with first and second switching transistors of first and second peripheral regions respectively coupled to first and second pre-decoders according to aspects of the disclosure; and FIGS. 6A-6B and 7A-7D illustrate steps of a method of forming the non-volatile memory apparatus according to aspects of the disclosure.

DETAILED DESCRIPTION

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of forming of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In an effort to reduce costs, three-dimensional (3D) flash memory (e.g., 3D NAND flash memory) utilizes an increasing number of word line layers. Such word line layers are typically connected to a metal layer above the word line layers. Thus, the area connecting the word line layers to the metal layer (commonly referred to as a stepped or terraced region) also requires an increased area. One approach is to shrink the pitch of each step in the stepped or terraced region; however, there are limits to shrinking the pitch as such steps need to be sufficiently coupled to the metal layer. Another approach is to arrange the contacts with each step in two dimensions as viewed from the top (e.g., arranging the contacts diagonally). Again, there are limits to the step sizes.

Figure 1:
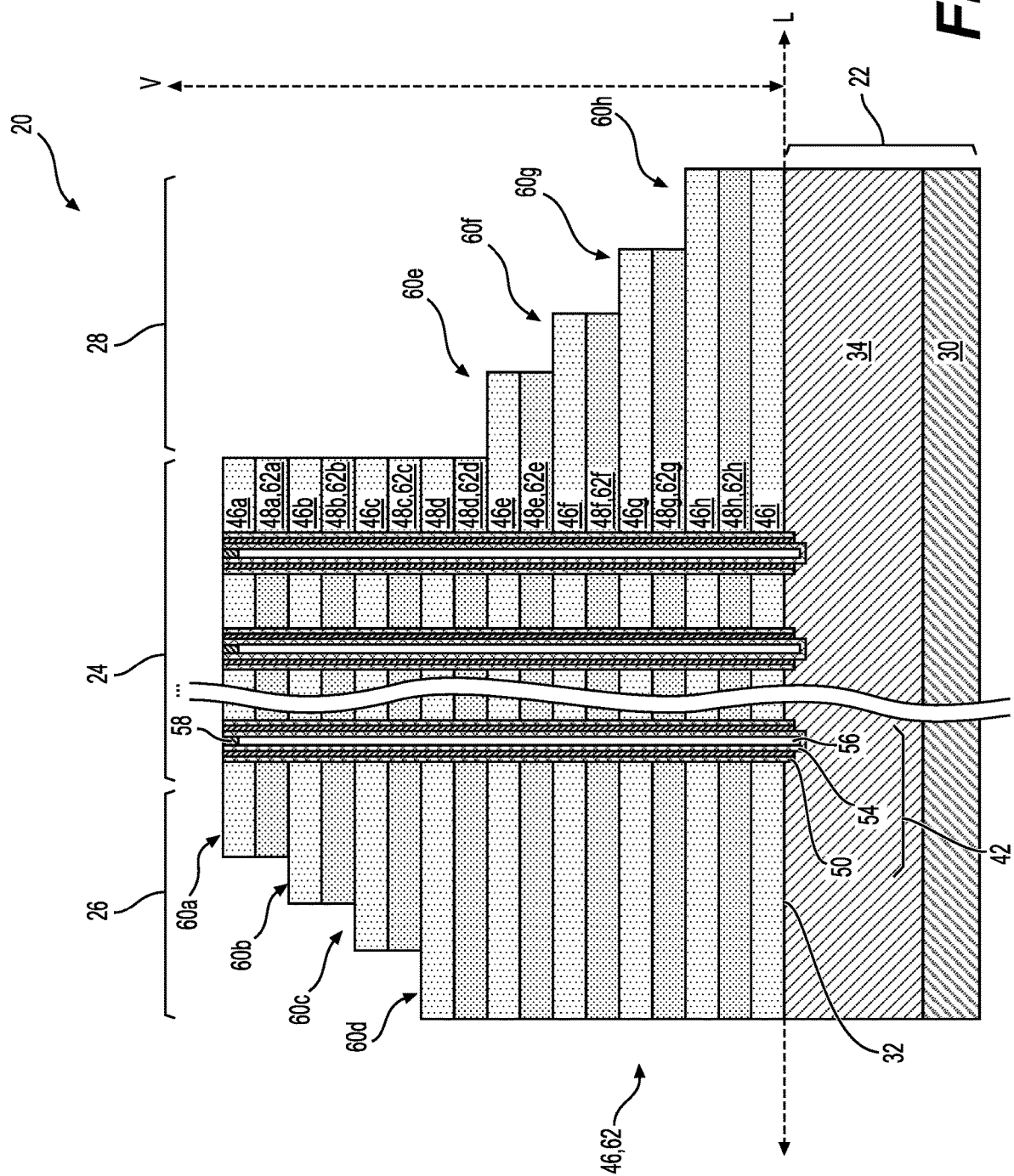

Referring to FIG. 1, a first embodiment of a non-volatile memory apparatus 20 of the present disclosure is illustrated. The first embodiment includes a substrate 22, which can be a semiconductor substrate. Various semiconductor devices can be formed on, or over, the substrate 22 employing methods known in the art. For example, an array of memory devices or cells can be formed in a device region 24. Electrically conductive contacts to the electrically conductive electrodes of the devices in the device region 24 can be subsequently formed in two stepped contact regions, a first contact region 26 and a second contact region 28, discussed in more detail below.

The substrate 22 can include a substrate semiconductor layer 30. The substrate semiconductor layer 30 may be a semiconductor material layer formed over an underlying substrate 22 or it may be an upper portion of a semiconductor substrate 22. The substrate semiconductor layer 30 can include at least one elemental semiconductor material, at least one III-V compound semiconductor material, at least one II-VI compound semiconductor material, at least one organic semiconductor material, or other semiconductor materials known in the art. The substrate 22 has a major surface 32, which can be, for example, a topmost surface of the substrate semiconductor layer 30 that extends laterally from and along a longitudinal axis L. The major surface 32 can be a semiconductor surface. In one embodiment, the major surface 32 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a balance band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition.

Optionally, at least one doped well 34 (e.g., p-type well) can be formed within the substrate semiconductor layer 30, such as a single crystalline silicon surface. In one embodiment, the substrate 22 can comprise a silicon substrate, and the non-volatile memory apparatus 20 can include a monolithic, three-dimensional array of NAND strings that includes a monolithic three-dimensional NAND string located over the silicon substrate. For example, at least one memory cell that is located in a first device level of the three-dimensional array of NAND strings can be located over another memory cell in a second device level of the three-dimensional array of NAND strings. The silicon substrate can contain an integrated circuit comprising a driver circuit for the at least one memory cell.

Figure 3:
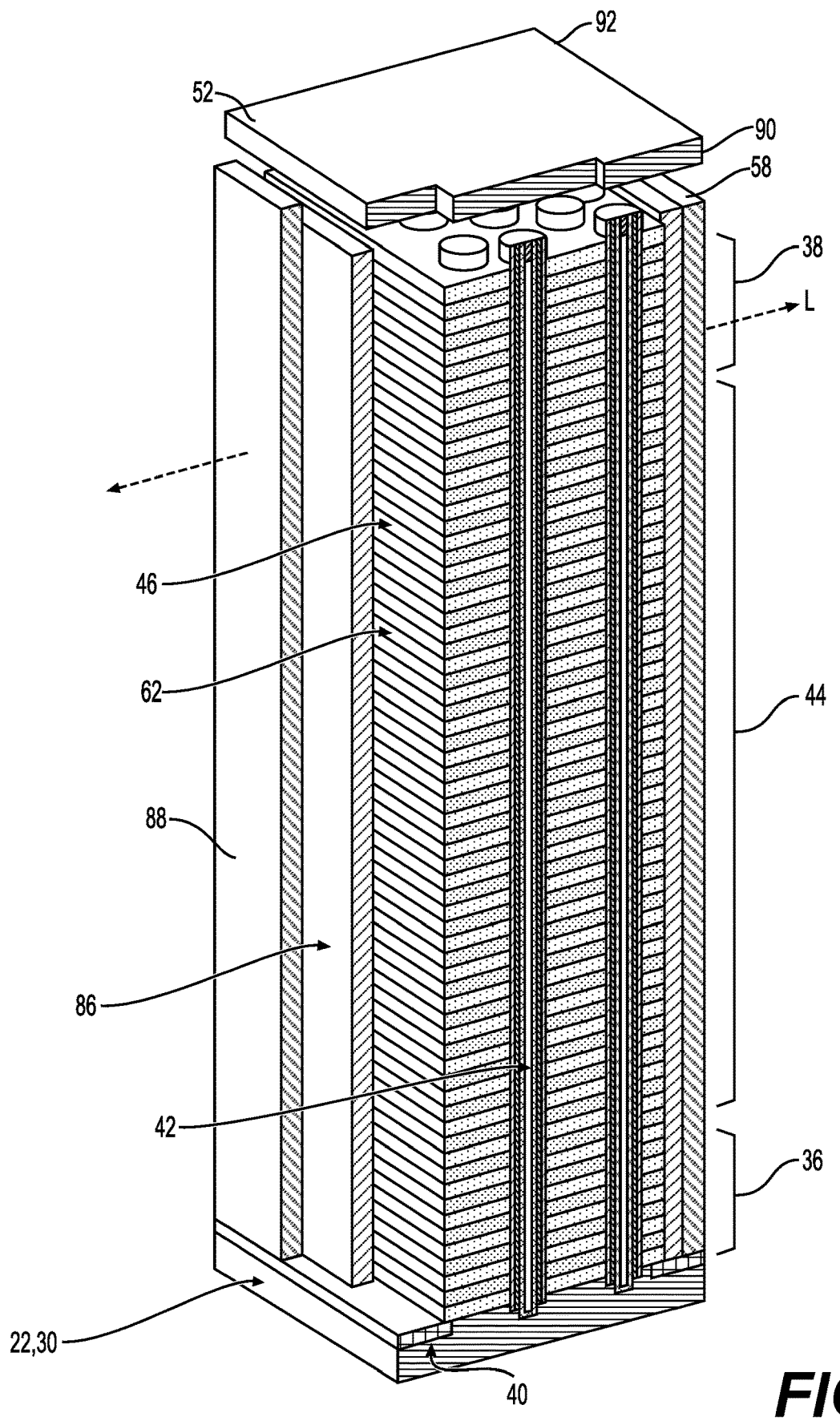
FIG. 3 is a three dimensional perspective view of the first embodiment of the non-volatile memory apparatus including multiple stacks according to aspects of the disclosure.

Optionally, select gate electrodes (in respective source side select gate level(s) 36 and drain side select gate level(s) 38 shown in FIG. 3) can be formed within, or on top of, the substrate semiconductor layer 30 using any suitable methods for implementing the array of vertical NAND strings. For example, a lower select gate device level may be fabricated as described in U.S. patent application Ser. No. 14/133,979, filed on Dec. 19, 2013, U.S. patent application Ser. No. 14/225,116, filed on Mar. 25, 2014, and/or U.S. patent application Ser. No. 14/225,176, filed on Mar. 25, 2014, all of which are incorporated herein by reference. While the present disclosure is described employing an embodiment in which a source region 40 is formed in a region longitudinally offset from a vertical portion of each channel and memory structure 42 (as shown in FIG. 3), and a horizontal or longitudinal portion of the substrate semiconductor layer 30 or the at least one doped well 34 that contacts the vertical portion of the channel and memory structure 42 can function as a horizontal or longitudinal portion of the channel, embodiments are expressly contemplated herein in which a first electrode or source region 40 is formed directly underneath channel and memory structures 42 of memory cells, as described in U.S. patent application Ser. No. 14/317,274, filed on Jun. 27, 2014, which is incorporated herein by reference. One or more source side select transistors can be formed in the source side select gate level(s) 36 between the top of the substrate semiconductor layer 30 and the bottommost control gate of the memory devices in the memory device levels 44, and one or more drain side select transistors can be formed in the drain side select gate level(s) 38 above the memory device levels 44.

A stack of alternating layers of a first material and a second material different from the first material is formed over the major surface 32 of the substrate 22. The major surface 32 of the substrate 22 can optionally include the top surface of a source electrode (e.g. such as the horizontal source line describe in U.S. patent application Ser. No. 14/317,274 filed on Jun. 27, 2014, incorporated herein by reference in its entirety) or the source region 40 (shown in FIG. 3) and/or a surface of a body region of a field effect transistor. In one embodiment, the stack can include an alternating plurality of insulator layers 46 and sacrificial layers 48. As used herein, an "an alternating plurality" of first elements and second elements refers to a structure in which an instance of the first elements and an instance of the second elements form a unit that is repeated within a stacked structure. The first elements may have the same thickness, or may have different thicknesses. The second elements may have the same thickness, or may have different thicknesses.

The stack of the alternating layers is herein referred to as an alternating stack 46, 48. In one embodiment, the alternating stack 46, 48 can include insulator layers 46 composed of the first material, and sacrificial layers 48 composed of a second material different from that of insulator layers 46. The sacrificial layers 48 may comprise an electrically insulating material, a semiconductor material, or a conductive material. The second material of the sacrificial layers 48 can be subsequently replaced with electrically conductive electrodes which can function, for example, as control gate electrodes of the non-volatile memory apparatus 20 (e.g., vertical NAND device).

The first material of the insulator layers 46 can be at least one electrically insulating material. As such, each insulator layer 46 can be an insulating material layer. Electrically insulating materials that can be employed for the insulator layers 46 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials.

The second material of the sacrificial layers 48 is a sacrificial material that can be removed selective to the first material of the insulator layers 46. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. Non-limiting examples of the second material include silicon nitride, an amorphous semiconductor material (such as amorphous silicon), and a polycrystalline semiconductor material (such as polysilicon).

In one embodiment, the insulator layers 46 can include silicon oxide, and sacrificial layers 48 can include silicon nitride sacrificial layers. The first material of the insulator layers 46 can be deposited, for example, by chemical vapor deposition (CVD). For example, if silicon oxide is employed for the insulator layers 46, tetraethyl orthosilicate (TEOS) can be employed as the precursor material for the CVD process. The second material of the sacrificial layers 48 can be formed, for example, CVD or atomic layer deposition (ALD).

The sacrificial layers 48 can be suitably patterned so that conductive material portions to be subsequently formed by replacement of the sacrificial layers 48 can function as electrically conductive electrodes, such as the control gate electrodes of the monolithic non-volatile memory apparatus 20 or three-dimensional NAND string memory devices to be subsequently formed. In various embodiments, the sacrificial layers 48 comprise a portion having a planar shape extending substantially parallel to the major surface 32 of the substrate 22.

In some embodiments, the thicknesses of the insulator layers 46 and the sacrificial layers 48 can be in a range from 20 nm to 180 nm, although lesser and greater thicknesses can be employed for each insulator layer 46 and for each sacrificial layer 48. The number of repetitions of the pairs of an insulator layer 46 and a sacrificial layer (e.g., a control gate electrode or a sacrificial material layer) 48 can be in a range from 2 to 1,024, and typically from 8 to 256, although a greater number of repetitions can also be employed. The top and bottom gate electrodes in the stack may function as the select gate electrodes. In one embodiment, each sacrificial layer 48 in the alternating stack 46, 48 can have a uniform thickness that is substantially invariant within each respective sacrificial layer 42.

The portion of the stack in the embodiment illustrated in FIG. 1 includes nine insulator layers 46a-46i and eight sacrificial layers 48a-48h for clarity. However, more than eight sacrificial layers 48 may be used in the stack (FIG. 3).

A lithographic material stack (not shown) including at least a photoresist layer can be formed over the alternating stack 46, 48, and can be lithographically patterned to form openings therein. The pattern in the lithographic material stack can be transferred through the entirety of the alternating stack 46, 48 by at least one anisotropic etch that employs the patterned lithographic material stack as an etch mask. Portions of the alternating stack 46, 48 underlying the openings in the patterned lithographic material stack are etched to form memory openings. In other words, the transfer of the pattern in the patterned lithographic material stack through the alternating stack 46, 48 forms the memory opening through the alternating stack 46, 48. The chemistry of the anisotropic etch process employed to etch through the materials of the alternating stack 46, 48 can alternate to optimize etching of the first and second materials in the alternating stack 46, 48. The anisotropic etch can be, for example, a series of reactive ion etches. Optionally, a sacrificial etch stop layer (not shown) may be employed between the alternating stack 46, 48 and the substrate 22. The sidewalls of the memory openings can be substantially vertical, or can be tapered. The patterned lithographic material stack can be subsequently removed, for example, by ashing.

Any remaining portion of the bottommost first material layer 46 underneath each memory opening is subsequently etched so that the memory openings extend from the top surface of the alternating stack 46, 48 to the substrate semiconductor layer 30, for example to the at least one doped well 34.

As used herein, a first element "overlies" a second element if a first horizontal plane including the bottommost point of the first element is within, or above, a second horizontal plane including a topmost point of the second element and if there exists an overlap between the area of the first element and the area of the second element in a see-through view along a direction perpendicular to the first and second horizontal planes. If a first element overlies a second element, the second element "underlies" the first element.

Each of the memory openings can include a sidewall (or a plurality of sidewalls) that extends substantially perpendicular to the major surface 32 of the substrate 22 and is defined by the physically exposed sidewall surfaces of the alternating stack 46, 48. Each of the memory openings can further include a bottom surface that corresponds to the major (i.e., top) surface 32 of the substrate 22 or that is located above or below the major surface 32 of the substrate 22.

The channel and memory structure (e.g., pillar structure) 42 can be formed within each memory opening through the alternating stack 46, 48. The channel and memory structures 42 can be formed, for example, by depositing a memory film layer 50 in the memory openings and over the alternating stack 46, 48, and by anisotropically etching the memory film layer 50. The memory film layer can be a stack of contiguous material layers that overlie the entirety of the alternating stack 46, 48. The memory film layer 50 contacts all sidewall surface(s) and all bottom surface(s) of the memory openings. The memory film layer 50 is a contiguous film stack that provides the functionality of charge storage in the absence of an external electrical bias voltage, while enabling charge transfer in the presence of a suitable external electrical bias voltage.

In one embodiment, the memory film layer 50 can be a stack, in the order of formation, of a blocking dielectric, a charge storage region (e.g., a charge storage layer), and a tunnel dielectric. In one embodiment, the charge storage region comprises a plurality of floating gates or a charge storage dielectric which is located between the tunneling dielectric layer and the blocking dielectric layer.

The blocking dielectric layer contacts the sidewalls of the memory openings. Specifically, the blocking dielectric layer can contact the sidewalls of the sacrificial layers 48. The blocking dielectric layer may include one or more dielectric material layers that can function as the dielectric material(s) of a control gate dielectric between the sacrificial layers 48 and charge storage regions to be subsequently formed out of the charge storage layer. The blocking dielectric layer can include silicon oxide, a dielectric metal oxide, a dielectric metal oxynitride, or a combination thereof. In one embodiment, the blocking dielectric layer can include a stack of at least one silicon oxide layer and at least one dielectric metal oxide layer. The blocking dielectric layer can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer can be in a range from 6 nm to 24 nm, although lesser and greater thicknesses can also be employed. Alternatively, the blocking dielectric layer may be omitted from the memory opening, and instead be formed through the backside contact trenches 52 (FIG. 3) in recesses formed by removal of the sacrificial layers 48 prior to forming the metal control gate electrodes or word lines through the backside contact trench 52.

The charge storage layer includes a dielectric charge trapping material, which can be, for example, silicon nitride, or a conductive material such as doped polysilicon or a metallic material. In one embodiment, the charge storage layer includes silicon nitride. The charge storage layer can be formed as a single charge storage layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer may comprise an insulating charge trapping material, such as one or more silicon nitride segments. Alternatively, the charge storage layer may comprise conductive nanoparticles such as metal nanoparticles, which can be, for example, ruthenium nanoparticles. The charge storage layer can be formed, for example, by chemical vapor deposition (CVD), atomic layer deposition (ALD), physical vapor deposition (PVD), or any suitable deposition technique for the selected material(s) for the charge storage layer. The thickness of the charge storage layer can be in a range from 2 nm to 20 nm, although lesser and greater thicknesses can also be employed.

The tunnel dielectric layer includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer can include a stack of a first silicon oxide layer, a silicon oxynitride layer, and a second silicon oxide layer, which is commonly known as an ONO stack. In one embodiment, the tunneling dielectric layer can include a silicon oxide layer that is substantially free of carbon or a silicon oxynitride layer that is substantially free of carbon. The thickness of the tunnel dielectric layer can be in a range from 2 nm to 20 nm, although lesser and greater thicknesses can also be employed.

Optionally, a permanent channel material layer (such as a polysilicon layer) and/or a sacrificial layer (such as a dielectric material layer) may be formed on the memory film layer 50. The memory film layer 50 (and any additional layer such as a permanent channel material layer or a sacrificial layer) can be anisotropically etched so that horizontal portions of the memory film layer 50 (and any additional layer) are removed from above the top surface of the alternating stack 46, 48 and at the bottom of each memory opening. Each remaining vertical portion of the memory film layer 50 that remains within a memory opening after the anisotropic etch constitutes a memory film 50.

A semiconductor channel 54 can be formed on inner sidewalls of each memory film 50 by deposition of a semiconductor material layer and a subsequent anisotropic etch of the semiconductor material layer. The semiconductor material layer can include a doped polycrystalline semiconductor material (such as doped polysilicon), or can include a doped amorphous semiconductor material (such as amorphous silicon) that can be subsequently converted into a doped polycrystalline semiconductor material after a suitable anneal at an elevated temperature.

Optionally, a dielectric core 56 can be formed within a cavity inside each semiconductor channel 54, for example, by deposition of a dielectric material such as silicon oxide, and subsequent planarization of the dielectric material. The planarization of the dielectric material removes the portion of the deposited dielectric material from above the top surface of the horizontal plane including the top surface of the alternating stack 46, 48. The planarization of the dielectric material can be performed, for example, by chemical mechanical planarization. Each remaining portion of the dielectric material inside a memory opening constitutes a dielectric core 56. The dielectric core 56 is an optional component, and a combination of a memory film 50 and a semiconductor channel 54 may completely fill a memory opening. A memory film 50, a semiconductor channel 54, and a dielectric core 56 within a same memory opening constitutes a channel and memory structure 42.

Drain regions 58 can be formed by recessing a top portion of each dielectric core 56 and depositing a doped semiconductor material. The doped semiconductor material can be, for example, doped polysilicon. Excess portions of the deposited semiconductor material can be removed from above the top surface of the alternating stack 46, 48, for example, by chemical mechanical polishing (CMP) or a recess etch.

As discussed above and shown in FIG. 1, the first embodiment of the non-volatile memory apparatus includes the first stepped contact region 26 having a terrace structure, and the second stepped contact region 28 also having a terrace structure. The first stepped contact region 26 includes a plurality of first steps 60a, 60b, 60c, 60d. Each first step 60a, 60b, 60c, 60d of the first stepped contact region 26 exposes a portion of a top surface of a respective insulator layer 46. In various embodiments, one of the plurality of first steps (e.g., 60a) corresponds to a terrace opening. In some embodiments, each first step 60a, 60b, 60c, 60d of the first stepped contact region 26 exposes a portion of a top surface of an upper insulator layer 46 and a side of a sacrificial layer 48 located immediately below the upper insulator layer 46 (except for the top most insulator layer 46a). The second stepped contact region 28 includes a plurality of second steps 60e, 60f, 60g, 60h. Each second step 60e, 60f, 60g, 60h of the second stepped contact region 28 exposes a portion of a top surface of a respective insulator layer 46. In some embodiments, each second step 60e, 60f, 60g, 60h of the second stepped contact region 28 exposes a portion of a top surface of a lower insulator layer 46 and a side of lower sacrificial layer 48 located immediately above the lower insulator layer 46.

So, the first stepped contact region 26 in the embodiment illustrated in FIG. 1 includes an initial first step 60a exposing a top surface of first insulator layer 46a. The first stepped contact region 26 further includes a secondary first step 60b exposing a side of first insulator layer 46a and a side of first sacrificial layer 48a, and a portion of a top surface of second insulator layer 46b. The first stepped contact region 26 further includes a tertiary first step 60c exposing a side of second insulator layer 46b and a side of second sacrificial layer 48b, and a portion of a top surface of third insulator layer 46c. The first stepped contact region 26 further includes a quaternary first step 60d exposing a side of third insulator layer 46c and a side of third sacrificial layer 48c, and a portion of a top surface of fourth insulator layer 46d.

The second stepped contact region 28 in the embodiment illustrated in FIG. 1 includes an initial second step 60e exposing a top surface of fifth insulator layer 46e. The first stepped contact region 26 further includes a secondary second step 60f exposing a side of fifth insulator layer 46e and a side of fifth sacrificial layer 48e, and a portion of a top surface of sixth insulator layer 46f. The first stepped contact region 26 further includes a tertiary second step 60g exposing a side of sixth insulator layer 46f and a side of sixth sacrificial layer 48f, and a portion of a top surface of seventh insulator layer 46g. The first stepped contact region 26 further includes a quaternary second step 60h exposing a side of seventh insulator layer 46g and a side of seventh sacrificial layer 48g, and a portion of a top surface of eighth insulator layer 46h.

The sacrificial layers 48 are subsequently replaced with electrically conductive word electrodes (e.g., NAND word lines/control gate electrodes) 62 through the back side trenches 52 (FIG. 3). Thus, FIG. 1 also shows the plurality of word lines 62 replacing the respective sacrificial layers 48.

More specifically, embodiments of the disclosure includes at least one stack 46, 62 of insulator layers 46 and electrically conductive electrodes or word lines 62 extending along and over the major surface 32 of the substrate 22 longitudinally and alternating with and overlying one another along a vertical axis V to define the device region 24. As shown, the vertical axis V is perpendicular to the longitudinal axis L and the device region 24 is disposed centrally along the longitudinal axis L. The plurality of word lines 62 comprise a first set of word lines and a second set of word lines exclusive of the first set of word lines.

As shown, the first set of word lines each extends longitudinally beyond a first side 64 of the device region 24 a decreasing longitudinal distance from the device region 24 as a vertical distance along the vertical axis V from the major surface 32 increases to define the first stepped contact region 26. Each of the plurality of first steps 60a, 60b, 60c, 60d includes a first contact portion 66 of the corresponding word lines 62 of the first set of word lines. Similarly, the second set of word lines each extends longitudinally beyond a second side 68 of the device region 24 opposite the first side 64 a decreasing longitudinal distance from the device region 24 as the vertical distance along the vertical axis V from the major surface 32 increases to define the second stepped contact region 28. Each of the plurality of second steps 60e, 60f, 60g, 60h includes a second contact portion 70 of the corresponding word lines 62 of the second set of word lines.

In the first embodiment of the non-volatile memory apparatus 20 shown, the first set of word lines are a plurality of upper word lines 62a, 62b, 62c, 62d disposed remotely from the major surface 32. In addition, the second set of word lines are a plurality of lower word lines 62e, 62f, 62g, 62h disposed below the upper word lines 62a, 62b, 62c, 62d along the vertical axis V and adjacent the major surface 32. Consequently, the plurality of upper word lines 62a, 62b, 62c, 62d are spaced from the major surface 32 along the vertical axis V by the plurality of lower word lines 62e, 62f, 62g, 62h.

Figure 2A:
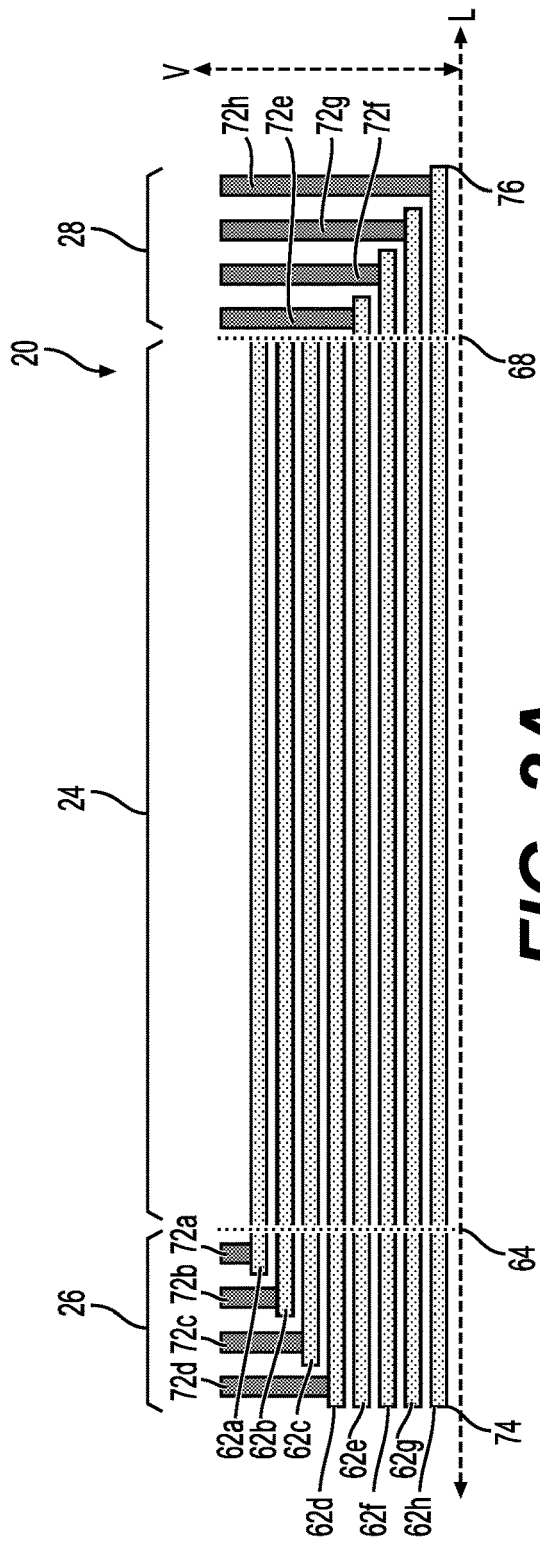
FIG. 2B illustrates a plan view of a first and second stack of the first embodiment of the non-volatile memory apparatus shown in FIG. 2A according to aspects of the disclosure.
Figure 2B:
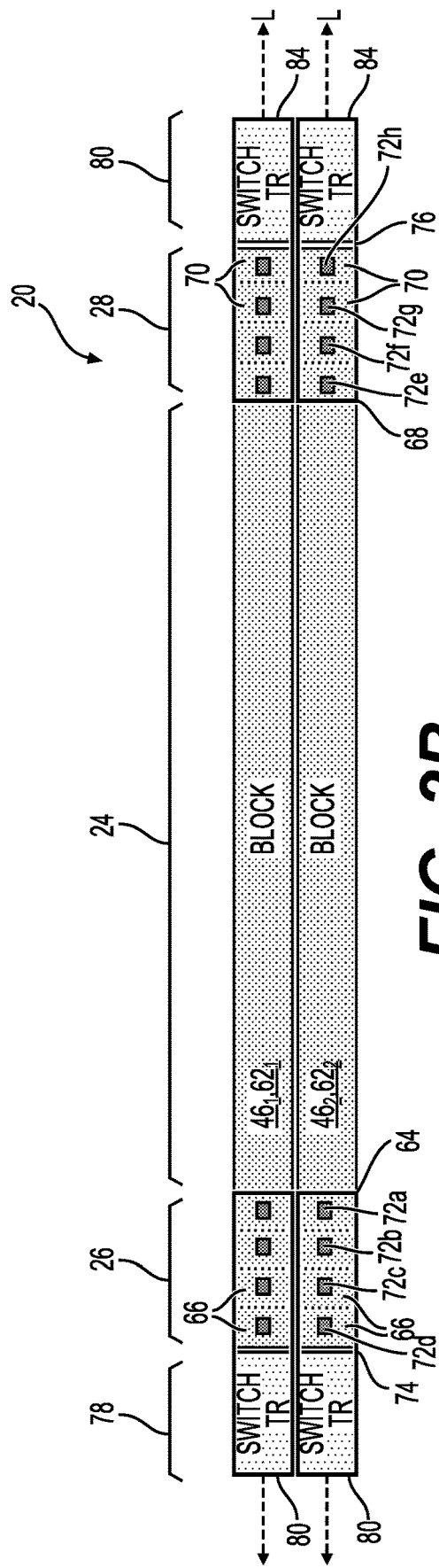

FIG. 2A is another vertical cross-sectional view of the first embodiment of the non-volatile memory apparatus 20 and FIG. 2B illustrates the plan (i.e., top) view of the first embodiment of the non-volatile memory apparatus 20 shown in FIGS. 1 and 2A. As shown, a plurality of electrically conductive via contacts (e.g., word line contacts) 72 are each in electrical contact with the corresponding electrically conductive electrode or word line of the plurality of word lines 62. So, the first embodiment shown in FIGS. 1, 2A, and 2B includes nine insulator layers 46a-46i and eight electrically conductive via contacts 72a-72h, each in electrical contact with a corresponding one of eight electrically conductive electrodes or word lines 62a-62h. Such layers 46a-46i, 72a-72h can be numbered or assigned a different integer according to their position along the vertical axis V.

As best shown in FIGS. 2A and 2B, the first stepped contact region 26 includes a first plurality of word line contacts 72a, 72b, 72c, 72d each extending along the vertical axis V and arranged next to one another rectilinearly along the longitudinal axis L. Each of the first plurality of word line contacts 72a, 72b, 72c, 72d is in contact with a respective first contact portion 66 of one of the first set of word lines. So, the first stepped contact region 26 includes via contacts 72a, 72b, 72c, 72d that are electrically connected to upper word lines 62a, 62b, 62c, 62d, respectively. Yet, at least a portion of the second set of word lines in the first stepped contact region 26 do not contact the first plurality of word line contacts 72a, 72b, 72c, 72d.

Similarly, the second stepped contact region 28 includes a second plurality of word line contacts 72e, 72f, 72g, 72h each extending along the vertical axis V and arranged next to one another rectilinearly along the longitudinal axis L. Each of the second plurality of word line contacts 72e, 72f, 72g, 72h is in contact with a respective contact portion 70 of one of the second set of word lines. Thus, the second stepped contact region 28 includes via contacts 72e, 72f, 72g, 72h that are electrically connected to lower word lines 62e, 62f, 62g, 62h, respectively. However, at least a portion of the first set of word lines in the second stepped contact region 28 do not contact the second plurality of word line contacts 72e, 72f, 72g, 72h.

Thus, the via contacts 72 in each stepped contact region 26, 28 contact only some of the word lines (e.g., only upper or lower word lines) that extend into the stepped contact region 26, 28. So, the number of via contacts 72 and interconnects (not shown) required for each stepped contact region 26, 28 is reduced by about half or by exactly half compared to known apparatuses that have via contacts for all of the plurality of word lines in each stepped contact region.

Referring specifically to FIG. 2B, the first stepped contact region 26 extends longitudinally from the first side of the device region 24 to a first contact periphery 74. The second stepped contact region 28 extends longitudinally from the second side of the device region 24 to a second contact periphery 76. As shown, the non-volatile memory apparatus 20 includes a first peripheral region 78 extending longitudinally from the first contact periphery 74 including a plurality of first switching transistors 80. The first switching transistors 80 are electrically coupled to the first plurality of word line contacts 72a, 72b, 72c, 72d. Similarly, a second peripheral region 82 extends longitudinally from the second contact periphery 76 and includes a plurality of second switching transistors 84 electrically coupled to the second plurality of word line contacts 72e, 72f, 72g, 72h. Also, as shown, the first set of word lines (e.g., upper word lines 62a, 62b, 62c, 62d) do not extend longitudinally beyond the second side 68 of the device region 24 and the second set of word lines (e.g., lower word lines 62e, 62f, 62g, 62h) extend longitudinally under the first set of word lines to the first contact periphery 74. Nevertheless, it should be appreciated that the first and second sets of word lines 62 may be arranged to extend in an alternative fashion.

Still referring to FIG. 2B, the at least one stack includes a first stack $46_1$, $62_1$ and a second stack $46_2$, $62_2$ arranged laterally next to one another. Thus, the first peripheral region 78 of the first stack $46_1$, $62_1$ is laterally adjacent the first peripheral region 78 of the second stack $46_2$, $62_2$ and the second peripheral region 82 of the first stack $46_1$, $62_1$ is laterally adjacent the second peripheral region 82 of the second stack $46_2$, $62_2$. In addition, the first contact portions 66 of the first set of word lines of the first stack $46_1$, $62_1$ are adjacent the first contact portions 66 of the first set of word lines of the second stack $46_2$, $62_2$. The second contact portions 70 of the second set of word lines of the first stack $46_1$, $62_1$ are also adjacent the second contact portions 70 of the second set of word lines of the second stack $46_2$, $62_2$.

Referring to FIG. 3 (a perspective or three dimensional view of the non-volatile memory apparatus 20 shown in FIGS. 1 and 2A with multiple stacks), an insulating material 86, such as silicon oxide, is located on the sidewalls of the backside trenches 52 and conductive source lines 88, such as tungsten or titanium nitride/tungsten bilayer lines, are located over the insulating material 86 in the backside trenches 52 in contact with the source regions 40. Drain electrodes 90 and drain lines 92 are located over the stack 46, 62 in electrical contact with the drain regions 58. One or more source side select transistors are located in the source side select gate level(s) 36 between the top of the substrate semiconductor layer 30 and the bottommost control gate/ word line 62 of the memory devices in the memory device levels 44, and one or more drain side select transistors are located in the drain side select gate level(s) 38 above the memory device levels 44.

While the first and second sets of word lines are discussed above as respectively being the plurality of upper word lines 62a, 62b, 62c, 62d and the plurality of lower word lines 62e, 62f, 62g, 62h, the first and second sets of word lines could instead be alternatively selected. For example, the first set of word lines can be located in odd numbered device levels and the second set of word lines can be located in even numbered device levels over the major surface 32 of the substrate 22. So, in a second embodiment of the non-volatile memory apparatus 20' shown in FIG. 4, the first stepped contact region 26 includes via contacts 72a, 72c, 72e, 72g that are electrically connected to odd numbered word lines 62a, 62c, 62e, 62g, respectively. The second stepped contact region 28 includes via contacts 72b, 72d, 72f, 72h that are electrically connected to even numbered word lines 62b, 62d, 62f, 62h respectively. Other schemes of selecting the first and second sets of word lines 62 are also contemplated.

An additional view of the first stack $46_1$, $62_1$ and second stack $46_2$, $62_2$ is illustrated in FIG. 5. As shown, a first pre-decoder 94 is operatively coupled to the plurality of first switching transistors 80. The first pre-decoder 94 is configured to control only the first set of word lines of each of the first stack $46_1$, $62_1$ and the second stack $46_2$, $62_2$ and not the second set of word lines of each of the first stack $46_1$, $62_1$ and the second stack $46_2$, $62_2$. A second pre-decoder 96 is operatively coupled to the plurality of second switching transistors 84. The second pre-decoder 96 is configured to control only the second set of word lines of each of the first stack $46_1$, $62_1$ and the second stack $46_2$, $62_2$ and not the first set of word lines of each of the first stack $46_1$, $62_1$ and the second stack $46_2$, $62_2$.

If, for example, the first and second stepped contact regions 26, 28 each included word line contacts 72 for the total number of the plurality of word lines 62, the stepped contact regions 26, 28 would require a larger area and/or may require the use of dummy stepped contact regions or sub-regions that do not contain via contacts or interconnects (if switching transistors are located on both sides of the device region 24 for connection to alternate blocks). For instance, the width (i.e., distance along the longitudinal axis L) of the stepped contact regions 26, 28 would be larger than those of the disclosed non-volatile memory apparatus 20 because all of the plurality of word lines 62 would have a corresponding word line contact 72 in each of the stepped contact regions 26, 28. The width of the of the stepped contact regions 26, 28 in disclosed non-volatile memory apparatus 20 is reduced in comparison, since each of the first and second stepped contact regions 26, 28 only include word line contacts for one half of the total number of the plurality of word lines. As a result of the reduced width, wire routing (e.g., interconnects) from the switching transistors 80, 84 to the word line contacts 72 can be shorter (e.g., along the longitudinal axis L). The wiring typically has a high resistance due to its own narrow width (in order to route many wires in limited pitch), so shorter wiring can help to reduce the wiring resistance. Thus, the plurality of word lines 62 can "settle" faster (e.g., change voltage level more quickly).

As best shown in FIGS. 6A-6B and 7A-7D, a method of forming a non-volatile memory apparatus 20, 20' is also provided. The method includes the step of 100 providing a substrate 22 having a major surface 32 extending laterally from and along a longitudinal axis L. Next, 102 alternating and overlying a plurality of word lines 62 and insulating layers 46 over the major surface 32 of the substrate 22 longitudinally to form at least one stack 46, 62 defining a device region 24 disposed centrally along the longitudinal axis L, wherein the plurality of word lines 62 comprise a first set of word lines and a second set of word lines exclusive of the first set of word lines. In more detail, the step of 102 alternating and overlying the plurality of word lines 62 and insulating layers 46 extending along and over the major surface 32 of the substrate 22 longitudinally to form the at least one stack 46, 62 defining the device region 24 disposed centrally along the longitudinal axis L is further defined as alternating and overlying the plurality of word lines 62 and insulating layers 46 extending parallel along and over the major surface 32 of the substrate 22 longitudinally to form the at least one stack 46, 62 defining a device region 24 disposed centrally along the longitudinal axis L. However, it should be appreciated that the word lines 62 and insulating layers 46 may not be exactly parallel to the major surface 32.

According to an aspect, the method can include the step of 104 arranging the first set of word lines as a plurality of upper word lines 62a, 62b, 62c, 62d disposed remotely from the major surface 32. The method can then include the step of 106 arranging the second set of word lines as a plurality of lower word lines 62e, 62f, 62g, 62h disposed below the upper word lines 62a, 62b, 62c, 62d along the vertical axis V and adjacent the major surface 32, wherein the plurality of upper word lines 62a, 62b, 62c, 62d are spaced from the major surface 32 along the vertical axis V by the plurality of lower word lines 62e, 62f, 62g, 62h. Alternatively, the method can include the step of arranging the first set of word lines in odd numbered device levels (i.e., odd numbered word lines 62a, 62c, 62e, 62g) and the second set of word lines in even numbered device levels (i.e., even numbered word lines 62b, 62d, 62f, 62h) over the major surface 32 of the substrate 22.

The method continues with the step of 108 extending each of the first set of word lines longitudinally beyond a first side 64 of the device region 24 a decreasing longitudinal distance from the device region 24 as a vertical distance along the vertical axis V from the major surface 32 increases to define a first stepped contact region 26 having a plurality of first steps (e.g., first steps 60a, 60b, 60c, 60d) each including a first contact portion 66. The method continues by 110 extending each of the second set of word lines longitudinally beyond a second side 68 of the device region 24 opposite the first side 64 a decreasing longitudinal distance from the device region 24 as the vertical distance along the vertical axis V from the major surface 32 increases to define a second stepped contact region 28 having a plurality of second steps (e.g., second steps 60e, 60f, 60g, 60h) each including a second contact portion 70. The next step of the method is 112 forming a first plurality of word line contacts (e.g., word lines contacts 72a, 72b, 72c, 72d) each extending along the vertical axis V and arranged next to one another rectilinearly along the longitudinal axis L in the first stepped contact region 26, wherein each of the first plurality of word line contacts is in contact with a respective first contact portion 66 of one of the first set of word lines and at least a portion of the second set of word lines in the first stepped contact region 26 do not contact the first plurality of word line contacts. The method proceeds with the step of 114 forming a second plurality of word line contacts (e.g., word lines contacts 72e, 72f, 72g, 72h) each extending along the vertical axis V and arranged next to one another rectilinearly along the longitudinal axis L in the second stepped contact region 28, wherein each of the second plurality of word line contacts is in contact with a respective second contact portion 70 of one of the second set of word lines and at least a portion of the first set of word lines in the second stepped contact region 28 do not contact the second plurality of word line contacts.

The method can also include the step of 116 forming a plurality of semiconductor channels 54 in the device region 24 of the at least one stack 46, 62, wherein at least one end portion of each of the plurality of the semiconductor channels 54 extends substantially perpendicular to the major surface 32 of the substrate 22 through the at least one stack 46, 62. The method can then include the step of 118 forming a plurality of memory films 50 in the device region 24 of the at least one stack 46, 62, wherein each of the plurality of memory films 50 is located adjacent to a respective one of the plurality of semiconductor channels 54.

The method can proceed with the step of 120 extending the first stepped contact region 26 longitudinally from the first side 64 of the device region 24 to a first contact periphery 74. Next, 122 extending the second stepped contact region 28 longitudinally from the second side 68 of the device region 24 to a second contact periphery 76. According to an aspect, the method can include the steps of 124 forming the first set of word lines to not extend longitudinally beyond the second side 68 of the device region 24 and 126 forming the second set of word lines extend longitudinally under the first set of word lines to the first contact periphery 74. The method can continue by 128 electrically coupling a plurality of first switching transistors 80 to the first plurality of word line contacts (e.g., word lines contacts 72a, 72b, 72c, 72d) in a first peripheral region 78 extending longitudinally from the first contact periphery 74. The next step of the method is 130 electrically coupling a plurality of second switching transistors 84 to the second plurality of word line contacts (e.g., word lines contacts 72e, 72f, 72g, 72h) in a second peripheral region 82 extending longitudinally from the second contact periphery 76.

If the at least one stack 46, 62 includes the first stack 46₁, 62₁ and the second stack 46₂, 62₂ (e.g., as shown in FIG. 2B, for example), the method can further include the step of 132 arranging the first stack 46₁, 62₁ and the second stack 46₂, 62₂ laterally next to one another with the first peripheral region of the first stack 46₁, 62₁ laterally adjacent the first peripheral region of the second stack 46₂, 62₂ and the second peripheral region of the first stack 46₁, 62₁ laterally adjacent the second peripheral region of the second stack 46₂, 62₂. As described above, the first contact portions 66 of the first set of word lines of the first stack 46₁, 62₁ can be adjacent the first contact portions 66 of the first set of word lines of the second stack 46₂, 62₂ and the second contact portions 70 of the second set of word lines of the first stack 46₁, 62₁ can be adjacent the second contact portions 70 of the second set of word lines of the second stack 46₂, 62₂. Thus, the method can further include the step of 134 coupling a first pre-decoder 94 to the plurality of first switching transistors 80 and controlling only the first set of word lines of each of the first stack 46₁, 62₁ and the second stack 46₂, 62₂ and not the second set of word lines of each of the first stack 46₁, 62₁ and the second stack 46₂, 62₂ using the first pre-decoder 94. Next, 136 coupling a second pre-decoder 96 to the plurality of second switching transistors 84 and controlling only the second set of word lines of each of the first stack 46₁, 62₁ and the second stack 46₂, 62₂ and not the first set of word lines of each of the first stack 46₁, 62₁ and the second stack 46₂, 62₂ using the second pre-decoder 96.

The device of the embodiments of the present disclosure shown in FIGS. 1-5 and formed by the steps shown in FIGS. 6A-7D solves this area problem by splitting the word line contacts to sub-regions or stepped contact regions 26, 28 located on both sides of the device region 24 between adjacent back side trenches 52. Each sub-region contains about half of the via contacts 72 and interconnects compared to known memory apparatuses.

The configuration of the embodiments of the disclosure is advantageous because it does not require radical process changes and because it cuts the required sub-region area (i.e., the area of each stepped contact region 26, 28) by about half compared to that of known apparatuses. Thus, a step 60 is needed for only about half of all word lines 62 in the stack 46,62. In contrast, a step may be formed on both sides of the device region for every word line in the known apparatuses, and about half of the sub-regions are left unused as dummy sub-regions i.e., regions with no contacts 72). Thus, such apparatuses utilize valuable space over the substrate 22 less efficiently.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. A memory apparatus, comprising:
   a substrate;
   at least one stack of a plurality of word lines, wherein the plurality of word lines comprise a first set of word lines and a second set of word lines, the second set of word lines being located between the first set of word lines and the substrate;
   the first set of word lines extend longitudinally beyond a first side of a device region as a vertical distance along a vertical axis from a major surface of the substrate increases to define a first stepped contact region having a plurality of first steps;
   the second set of word lines extend longitudinally beyond a second side of the device opposite of the first side of the device a decreasing longitudinal distance from the device region as the vertical distance along the vertical axis from the major surface increases define a second stepped contact region having a plurality of second steps, the first stepped contact region and the second stepped contact region being on opposite sides of a device region;
   the first set of word lines terminate at and do not extend into the second stepped contact region;
   a first plurality of word line contacts extending along the vertical axis and arranged next to one another rectilinearly along the longitudinal axis in the first stepped contact region and contacting respective contact portions of the first set of word lines, the first plurality of word line contacts not contacting the second set of word lines; and
   a second plurality of word line contacts extending along the vertical axis and arranged next to one another rectilinearly along the longitudinal axis in the second stepped contact region and contacting respective contact portions of the second set of word lines, the second plurality of word line contacts not contacting the first set of word lines.

2. The apparatus as set forth in claim 1, wherein the major surface of the substrate extends laterally from and along a longitudinal axis;
   and wherein the at least one stack of the plurality of word lines includes the plurality of word lines and a plurality of insulating layers extending along and over the major surface of the substrate longitudinally and alternating with and overlying one another along the vertical axis perpendicular to the longitudinal axis to define the device region disposed centrally along the longitudinal axis.

3. The apparatus as set forth in claim 2, wherein the first set of word lines do not extend longitudinally beyond the second side of the device region and the second set of word lines extend longitudinally under the first set of word lines to the first contact portion.

4. The apparatus as set forth in claim 2, wherein the first set of word lines are a plurality of upper word lines disposed remotely from the major surface and the second set of word lines are a plurality of lower word lines disposed below the upper word lines along the vertical axis and adjacent the major surface, wherein the plurality of upper word lines are spaced from the major surface along the vertical axis by the plurality of lower word lines.

5. The apparatus as set forth in claim 2, further including a plurality of semiconductor channels located in the device region of the at least one stack, wherein at least one end portion of each of the plurality of the semiconductor channels extends substantially perpendicular to the major surface of the substrate through the at least one stack.

6. The apparatus as set forth in claim 5, further including a plurality of memory films located in the device region of the at least one stack, wherein each of the plurality of memory films is located adjacent to a respective one of the plurality of semiconductor channels.

7. The apparatus as set forth in claim 1, wherein the first stepped contact region extends longitudinally from the first side of the device region to a first contact periphery and the second stepped contact region extends longitudinally from the second side of the device region to a second contact periphery and further including a first peripheral region extending longitudinally from the first contact periphery and including a plurality of first switching transistors electrically coupled to the first plurality of word line contacts and a second peripheral region extending longitudinally from the second contact periphery and including a plurality of second switching transistors electrically coupled to the second plurality of word line contacts.

8. The apparatus as set forth in claim 7, wherein the at least one stack includes a first stack and a second stack arranged laterally next to one another and the first peripheral region of the first stack is laterally adjacent the first peripheral region of the second stack and the second peripheral region of the first stack is laterally adjacent the second peripheral region of the second stack and the first contact portions of the first set of word lines of the first stack are adjacent the first contact portions of the first set of word lines of the second stack and the second contact portions of the second set of word lines of the first stack are adjacent the second contact portions of the second set of word lines of the second stack.

9. The apparatus as set forth in claim 8, further including:
a first pre-decoder operatively coupled to the plurality of first switching transistors and configured to control only the first set of word lines of each of the first stack and the second stack and not the second set of word lines of each of the first stack and the second stack; and
a second pre-decoder operatively coupled to the plurality of second switching transistors and configured to control only the second set of word lines of each of the first stack and the second stack and not the first set of word lines of each of the first stack and the second stack.

10. A method of forming a memory apparatus, the method comprising the steps of:
providing a substrate;
forming at least one stack of a plurality of word lines, wherein the plurality of word lines comprise a first set of word lines and a second set of word lines, the second set of word lines being located between the first set of word lines and the substrate;
extending the first set of word lines longitudinally beyond a first side of a device region as a vertical distance along a vertical axis from a major surface of the substrate increases to define a first stepped contact region having a plurality of first steps on one side of a device region;
extending the second set of word lines longitudinally beyond a second side of the device opposite of the first side of the device a decreasing longitudinal distance from the device region as the vertical distance along the vertical axis from the major surface increases to define a second stepped contact region having a plurality of second steps on an opposite side of the device region as the first stepped contact region;
terminating the first set of word lines at the second stepped contact region;
forming a first plurality of word line contacts extending along the vertical axis and arranged next to one another rectilinearly along the longitudinal axis in the first stepped contact region, wherein each of the first plurality of word line contacts is in contact with a respective first contact portion of one of the first set of word lines and at least a portion of the second set of word lines in the first stepped contact region do not contact the first plurality of word line contacts; and
forming a second plurality of word line contacts extending along the vertical axis and arranged next to one another rectilinearly along the longitudinal axis in the second stepped contact region, wherein each of the second plurality of word line contacts is in contact with a respective contact portion of one of the second set of word lines.

11. The method as set forth in claim 10, wherein the major surface of the substrate extends laterally from and along a longitudinal axis, and further including the step of:
alternating and overlying the plurality of word lines and a plurality of insulating layers over the major surface of the substrate longitudinally to form the at least one stack defining a device region disposed centrally along the longitudinal axis.

12. The method as set forth in claim 11, further including the steps of:
arranging the first set of word lines as a plurality of upper word lines disposed remotely from the major surface; and
arranging the second set of word lines as a plurality of lower word lines disposed below the upper word lines along the vertical axis and adjacent the major surface, wherein the plurality of upper word lines are spaced from the major surface along the vertical axis by the plurality of lower word lines.

13. The method as set forth in claim 11, further including the steps of:
extending the first stepped contact region longitudinally from the first side of the device region to a first contact periphery;
extending the second stepped contact region longitudinally from the second side of the device region to a second contact periphery;

electrically coupling a plurality of first switching transistors to the first plurality of word line contacts in a first peripheral region extending longitudinally from the first contact periphery; and electrically coupling a plurality of second switching transistors to the second plurality of word line contacts a second peripheral region extending longitudinally from the second contact periphery.

14. The method as set forth in claim 13, wherein the at least one stack includes a first stack and a second stack and the method further includes the step of arranging a first stack and a second stack laterally next to one another with the first peripheral region of the first stack laterally adjacent the first peripheral region of the second stack and the second peripheral region of the first stack laterally adjacent the second peripheral region of the second stack and the first contact portions of the first set of word lines of the first stack are adjacent the first contact portions of the first set of word lines of the second stack and the second contact portions of the second set of word lines of the first stack adjacent the second contact portions of the second set of word lines of the second stack.

15. The method as set forth in claim 14, further including the steps of:
coupling a first pre-decoder to the plurality of first switching transistors and controlling only the first set of word lines of each of the first stack and the second stack and not the second set of word lines of each of the first stack and the second stack using the first pre-decoder; and
coupling a second pre-decoder to the plurality of second switching transistors and controlling only the second set of word lines of each of the first stack and the second stack and not the first set of word lines of each of the first stack and the second stack using the second pre-decoder.

16. The method as set forth in claim 11, further including the steps of:
forming the first set of word lines to not extend longitudinally beyond the second side of the device region; and
forming the second set of word lines to extend longitudinally under the first set of word lines to the first contact periphery.

17. The method as set forth in claim 11, further including the step of forming a plurality of semiconductor channels in the device region of the at least one stack, wherein at least one end portion of each of the plurality of the semiconductor channels extends substantially perpendicular to the major surface of the substrate through the at least one stack.

18. The method as set forth in claim 17, further including the step of forming a plurality of memory films in the device region of the at least one stack, wherein each of the plurality of memory films is located adjacent to a respective one of the plurality of semiconductor channels.

19. The method as set forth in claim 11, wherein the step of alternating and overlying the plurality of word lines and insulating layers extending along and over the major surface of the substrate longitudinally to form the at least one stack defining the device region disposed centrally along the longitudinal axis is further defined as alternating and overlying the plurality of word lines and insulating layers extending parallel along and over the major surface of the substrate longitudinally to form the at least one stack defining a device region disposed centrally along the longitudinal axis.

* * * * *